United States Patent
Lee et al.

(10) Patent No.: US 8,698,572 B2
(45) Date of Patent: *Apr. 15, 2014

(54) DELAY LINE CALIBRATION

(75) Inventors: Chong U. Lee, San Diego, CA (US);
David Jonathan Julian, San Diego, CA (US); Amal Ekbal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 446 days.

This patent is subject to a terminal disclaimer.

(21) Appl. No.: 12/967,216

(22) Filed: Dec. 14, 2010

(65) Prior Publication Data

US 2011/0080203 A1     Apr. 7, 2011

Related U.S. Application Data

(63) Continuation of application No. 11/560,313, filed on Nov. 15, 2006, now Pat. No. 7,855,611.

(51) Int. Cl.
*H04B 3/04* (2006.01)
*H03H 11/26* (2006.01)
*H03H 7/30* (2006.01)
*H01P 9/00* (2006.01)

(52) U.S. Cl.
USPC .............................. 333/18; 333/139; 327/279

(58) Field of Classification Search
USPC ..................... 333/18, 138, 139; 327/158, 279
See application file for complete search history.

(56) References Cited

U.S. PATENT DOCUMENTS

| | | |
|---|---|---|
| 3,763,317 A | 10/1973 | Coleman, Jr. et al. |
| 3,909,752 A | 9/1975 | Stuart |
| 4,341,999 A | 7/1982 | Rudish et al. |
| 4,795,985 A | 1/1989 | Gailbreath, Jr. |
| 4,859,934 A | 8/1989 | Gale et al. |

(Continued)

FOREIGN PATENT DOCUMENTS

| | | |
|---|---|---|
| EP | 1096666 A2 | 5/2001 |
| EP | 1322039 A2 | 6/2003 |

(Continued)

OTHER PUBLICATIONS

International Search Report—PCT/US07/084400, International Search Authority—European Patent Office—Jul. 1, 2008.

(Continued)

*Primary Examiner* — Dean O Takaoka
*Assistant Examiner* — Alan Wong
(74) *Attorney, Agent, or Firm* — Paul S. Holdaway

(57) ABSTRACT

A tunable delay line is calibrated to maintain the delay of the delay line at a desired value or within a desired range of values. In some aspects a signal is passed through a delay line multiple times so that the cumulative delay of the signal through the delay line (e.g., as indicated by a count) may be calculated over a period of time. The count is compared with an expected count and, based on this comparison, the delay of the delay line is adjusted as necessary. In some aspects the signal may comprise a digital signal. In some aspects a delay through a delay line may be calculated based on analysis of amplitude changes in a signal caused by a phase shift imparted on the signal by the delay line. In some aspects a delay line is incorporated into a transmitted reference system to generate and/or process transmitted reference signals.

22 Claims, 14 Drawing Sheets

(56) References Cited

U.S. PATENT DOCUMENTS

| | | |
|---|---|---|
| 5,418,839 A | 5/1995 | Knuth et al. |
| 5,687,169 A | 11/1997 | Fullerton |
| 5,764,696 A | 6/1998 | Barnes et al. |
| 5,789,969 A | 8/1998 | Davis et al. |
| 5,812,081 A | 9/1998 | Fullerton |
| 5,832,035 A | 11/1998 | Fullerton |
| 5,907,427 A | 5/1999 | Scalora et al. |
| 5,952,956 A | 9/1999 | Fullerton |
| 5,960,031 A | 9/1999 | Fullerton et al. |
| 5,963,581 A | 10/1999 | Fullerton et al. |
| 5,969,663 A | 10/1999 | Fullerton et al. |
| 5,995,534 A | 11/1999 | Fullerton et al. |
| 6,031,862 A | 2/2000 | Fullerton et al. |
| 6,091,374 A | 7/2000 | Barnes |
| 6,111,536 A | 8/2000 | Richards et al. |
| 6,133,876 A | 10/2000 | Fullerton et al. |
| 6,167,245 A | 12/2000 | Welland et al. |
| 6,177,903 B1 | 1/2001 | Fullerton et al. |
| 6,218,979 B1 | 4/2001 | Barnes et al. |
| 6,259,330 B1 | 7/2001 | Arai |
| 6,295,019 B1 | 9/2001 | Richards et al. |
| 6,297,773 B1 | 10/2001 | Fullerton et al. |
| 6,300,903 B1 | 10/2001 | Richards et al. |
| 6,304,623 B1 | 10/2001 | Richards et al. |
| 6,351,652 B1 | 2/2002 | Finn et al. |
| 6,354,946 B1 | 3/2002 | Finn |
| 6,400,307 B2 | 6/2002 | Fullerton et al. |
| 6,400,329 B1 | 6/2002 | Barnes |
| 6,421,389 B1 | 7/2002 | Jett et al. |
| 6,430,208 B1 | 8/2002 | Fullerton et al. |
| 6,437,618 B2 | 8/2002 | Lee |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,904 B2 | 12/2002 | Richards |
| 6,492,906 B1 | 12/2002 | Richards et al. |
| 6,499,334 B1 | 12/2002 | Kobayashi |
| 6,501,393 B1 | 12/2002 | Richards et al. |
| 6,504,408 B1 | 1/2003 | Von Kaenel |
| 6,504,483 B1 | 1/2003 | Richards et al. |
| 6,512,455 B2 | 1/2003 | Finn et al. |
| 6,512,488 B2 | 1/2003 | Schantz |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,586,962 B2 | 7/2003 | Sakurai et al. |
| 6,593,886 B2 | 7/2003 | Schantz |
| 6,603,300 B2 | 8/2003 | Lin et al. |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,452 B2 | 9/2003 | Knockeart et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,700,538 B1 | 3/2004 | Richards |
| 6,710,736 B2 | 3/2004 | Fullerton et al. |
| 6,717,992 B2 | 4/2004 | Cowie et al. |
| 6,737,926 B2 | 5/2004 | Forbes |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,712 B2 | 7/2004 | Kim |
| 6,763,057 B1 | 7/2004 | Fullerton et al. |
| 6,763,282 B2 | 7/2004 | Glenn et al. |
| 6,774,859 B2 | 8/2004 | Fullerton et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Hall et al. |
| 6,823,022 B1 | 11/2004 | Fullerton et al. |
| 6,836,223 B2 | 12/2004 | Moore |
| 6,836,226 B2 | 12/2004 | Moore |
| 6,845,253 B2 | 1/2005 | Schantz |
| 6,847,675 B2 | 1/2005 | Fullerton et al. |
| 6,867,654 B2 | 3/2005 | Farooqui |
| 6,879,878 B2 | 4/2005 | Glenn et al. |
| 6,882,301 B2 | 4/2005 | Fullerton |
| 6,895,034 B2 | 5/2005 | Nunally et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,002,384 B1 | 2/2006 | Chong et al. |
| 7,015,793 B2 | 3/2006 | Gabig, Jr. et al. |
| 7,020,224 B2 | 3/2006 | Krivokapic |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,126,404 B1 * | 10/2006 | Rosen .................... 327/292 |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |
| 7,151,490 B2 | 12/2006 | Richards |
| 7,157,948 B2 | 1/2007 | McClannahan et al. |
| 7,167,525 B2 | 1/2007 | Santhoff et al. |
| 7,170,408 B2 | 1/2007 | Taylor et al. |
| 7,184,938 B1 | 2/2007 | Lansford et al. |
| 7,190,722 B2 | 3/2007 | Lakkis et al. |
| 7,190,729 B2 | 3/2007 | Siwiak |
| 7,205,806 B2 | 4/2007 | Chong et al. |
| 7,206,334 B2 | 4/2007 | Siwiak |
| 7,209,724 B2 | 4/2007 | Richards et al. |

(56) References Cited

U.S. PATENT DOCUMENTS

| | | |
|---|---|---|
| 7,230,980 B2 | 6/2007 | Langford et al. |
| 7,239,277 B2 | 7/2007 | Fullerton et al. |
| RE39,759 E | 8/2007 | Fullerton |
| 7,256,727 B2 | 8/2007 | Fullerton et al. |
| 7,271,779 B2 | 9/2007 | Hertel |
| 7,295,053 B2 | 11/2007 | Lesso |
| 7,716,001 B2 * | 5/2010 | Lee et al. ............... 702/107 |
| 7,855,611 B2 * | 12/2010 | Lee et al. ............... 333/18 |
| 2004/0012453 A1 | 1/2004 | Dally et al. |
| 2004/0196052 A1 | 10/2004 | Okayasu |
| 2005/0036578 A1 | 2/2005 | Heidel et al. |
| 2007/0133730 A1 | 6/2007 | Gregorius et al. |
| 2007/0217559 A1 | 9/2007 | Stott et al. |
| 2007/0285138 A1 | 12/2007 | Bhowmik et al. |
| 2008/0111601 A1 | 5/2008 | Lee et al. |
| 2008/0111653 A1 | 5/2008 | Lee et al. |

FOREIGN PATENT DOCUMENTS

| | | |
|---|---|---|
| JP | 8056157 A | 2/1996 |
| JP | 8292242 A | 11/1996 |
| JP | 9119962 A | 5/1997 |
| JP | 10336008 A | 12/1998 |
| JP | 11031024 A | 2/1999 |
| JP | 11110065 A | 4/1999 |
| JP | 11126479 A | 5/1999 |
| JP | 11316617 A | 11/1999 |
| JP | 2000076852 A | 3/2000 |
| JP | 2000183698 A | 6/2000 |
| JP | 2003130927 A | 5/2003 |

OTHER PUBLICATIONS

Written Opinion, PCT/US2007/084400—International Search Authority—Jul. 1, 2008.

* cited by examiner

[[US 8,698,572 B2]]

DELAY LINE CALIBRATION

CLAIM OF PRIORITY UNDER 35 U.S.C. §120

The present application for patent is a Continuation of patent application Ser. No. 11/560,313 entitled "DELAY LINE CALIBRATION" filed Nov. 15, 2006, allowed, and assigned to the assignee hereof and hereby expressly incorporated by reference herein.

CROSS-REFERENCE TO RELATED APPLICATION

This application is related to filed and commonly owned U.S. patent application Ser. No. 11/560,327, entitled "DELAY LINE CALIBRATION," now U.S. Pat. No. 7,716,001 issued May 11, 2010 and assigned.

BACKGROUND

1. Field

This application relates generally to communications and, in some aspects, to calibrating a delay line.

2. Background

A delay line provides a mechanism to impart a known delay on a signal. For example, a signal input into a delay line may exit the delay line relatively intact after a specified period of time. A typical use of a delay line involves delaying a clock signal to provide a clock signal with a different phase. Another typical use of a delay line involves delaying a signal in a circuit to align information in that signal (e.g., clock edges or data) with information in other signals. Another potential use relates to delays in ultra-wideband transmitted reference transmitters and receivers. For a transmitter, a given delay may be provided between a reference pulse and data pulse. For a receiver, that same delay may be imparted on a reference pulse to correlate the reference pulse with a data pulse. A delay line also may be used in a ring oscillator for clock generation, such as an inverter chain-based delay line. A delay line also may be used for a super regenerative receiver with a delay feedback through a gain element. Many other uses are possible.

In practice, the actual delay of a delay line may vary from its nominal, intended value. For example, factors such as integrated circuit process variations and temperature may cause the actual delay of the delay line to be higher or lower than the nominal value. The impact on the delay of the delay line due to integrated circuit process variations is relatively static. That is, once the delay line is manufactured, the actual delay of the delay line may be a specific value that is slightly below or above the nominal value. The impact on the delay of the delay line due to temperature variation may be relatively dynamic. Here, the delay may deviate over time in response to changes in temperature in the operating environment.

Accordingly, applications that require a relatively precise delay may incorporate some form of delay line calibration. For example, the delay of a tunable delay line may be varied based on the value of a control signal provided to the delay line. In this case, a control mechanism may be used to adjust the delay of the delay line to maintain the delay with a given range of values (e.g., a within certain percentage of the nominal delay). Here, provisions may be made to measure or estimate the current delay of the delay line. If this measurement or estimate indicates that the delay is not within the desired range of values, the control signal may be used to adjust the delay of the delay line back to an acceptable value.

SUMMARY

A summary of selected aspects of the disclosure follows. For convenience, one or more aspects of the disclosure may be referred to herein simply as "an aspect" or "aspects."

In some aspects a tunable delay line is calibrated to maintain the delay of the delay line within a desired range of values. A signal is fed into the delay line and the resulting output of the delay line is processed to obtain an indication of the delay through the delay line. The delay of the delay line is then adjusted as necessary based on the indication.

In some aspects a signal is passed through the delay line multiple times to calculate the cumulative delay imparted on the signal by the delay line over a period of time. The cumulative delay is then compared with an expected cumulative delay to determine whether the delay of the delay line needs to be adjusted. This may be accomplished, for example, by counting the number of times the signal is output by the delay line and comparing this count with an expected count.

In some aspects a pulse signal is fed into an input of the delay line and the output of the delay line is fed back to the input of the delay line. A counter coupled to an output of the delay line counts the number of times the pulse signal is output by the delay line. The count generated by the counter is then compared with an expected count to determine whether the delay imparted on the pulse signal by the delay line is within an expected range of values. Based on this comparison, an appropriate control signal may be provided to the delay line to adjust the delay if necessary.

In some aspects provisions may be made to compensate for distortion that may be imparted on a signal as a result of the signal being passed through the delay line multiple times. For example, gain in a feedback loop may be provided and adjusted, as necessary, to compensate for a change in the amplitude of the signal. In addition, a signal regenerator may be provided in the feedback loop to compensate for distortion of the signal.

In some aspects a digital signal may be repeatedly passed through a delay line. For example, a combiner such as an exclusive-or ("XOR") gate may couple a step signal and an output of the delay line to an input of the delay line. Here, as the step transition is fed from the output back to the XOR gate a transition will occur at the output of the XOR gate thereby causing a repetitive alternating signal to be fed into the delay line. A counter coupled to an output of the delay line may thereby count the number of times the signal is output by the delay line. This count may then be compared to an expected count and, based on this comparison, the delay of the delay line adjusted as necessary.

In some aspects a delay through a delay line may be calculated based on analysis of a phase shift that a delay line imparts on a signal. For example, a reference signal (e.g., a continuous signal such as a sine wave) may be provided to an input of the delay line to generate a delayed reference signal. The reference signal and the delayed reference signal may then be combined to generate a combined signal including phase components of both signals. The amplitude of the combined signal provides an indication as to the delay imparted on the delayed reference signal. Thus, by detecting the amplitude of the combined signal, the delay of the delay line may be adjusted as necessary.

In some aspects a delay line is incorporated into a transmitted reference system. In a transmitter reference system the transmitted waveform consist of a template pulse (e.g., a reference pulse) followed by a data pulse wherein a bit value may be encoded, for example, as a differential between the reference and data pulses. Here, the data pulse will follow the reference pulse by a known time interval. Accordingly, a delay line may be employed in a transmitter to provide the desired spacing between the reference and data pulses. Conversely, in a receiver, a delay line may be employed to delay a received reference pulse to line up the reference pulse in time with a corresponding data pulse.

BRIEF DESCRIPTION OF THE DRAWINGS

These and other features, aspects and advantages of the disclosure will be more fully understood when considered with respect to the following detailed description, appended claims and accompanying drawings, wherein:

Figure 1:
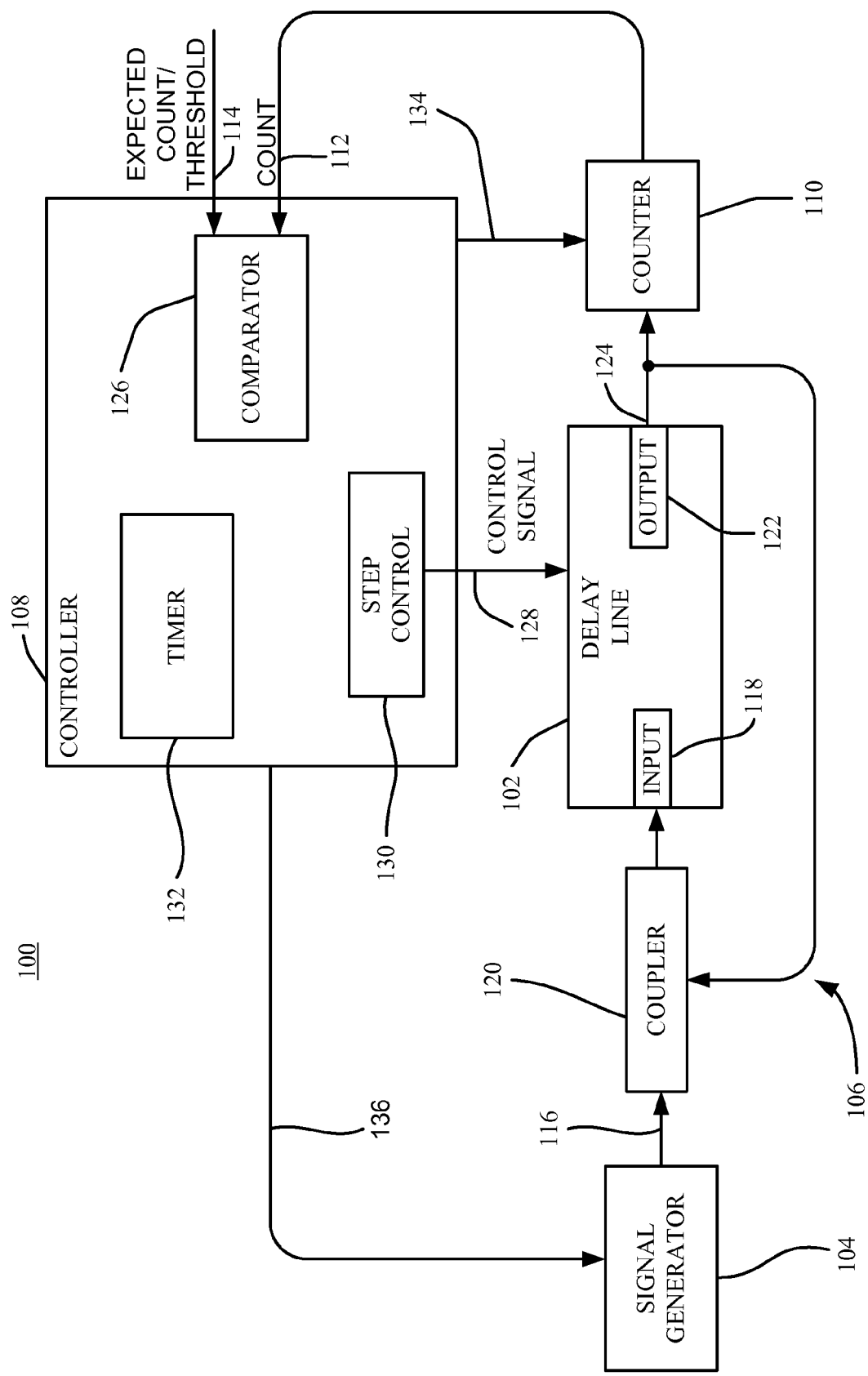
FIG. 1 is a simplified block diagram of several exemplary aspects of an apparatus that uses feedback to calibrate a delay line.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure and/or function disclosed herein is merely representative. Based on the teachings herein one skilled in the art should appreciate that an aspect disclosed herein may be implemented independently of any other aspects and that two or more of these aspects may be combined in various ways. For example, an apparatus may be implemented and/or a method practiced using any number of the aspects set forth herein. In addition, an apparatus may be implemented and/or a method practiced using other structure and/or functionality in addition to or other than one or more of the aspects set forth herein.

FIG. 1 illustrates certain aspects of an apparatus 100 for calibrating a delay line 102. Briefly, the delay line 102 is set up in a feedback configuration so that a signal from a signal generator 104 is repeatedly fed through the delay line 102 via a feedback path 106. A controller 108 calculates the resulting cumulative delay imparted on the signal to determine whether the delay of the delay line 102 is within a range of desired delay values. For example, the controller 108, in conjunction with a counter 110, may obtain a count 112 of the number of times the signal has passed through the delay line 102 within a given time period. The controller 108 compares this count with an expected count and/or a threshold 114 indicative of an expected value of the count for that time period. If the comparison indicates that the delay of the delay line 102 is not within the desired range, the controller 100 adjusts the delay of the delay line 102 accordingly.

Exemplary operations that may be used to calibrate a delay line will be discussed in conjunction with FIG. 2. For convenience, the operations of FIG. 2 (or any other flowchart herein) may be described as being performed by specific components. It should be appreciated, however, that these operations may be performed in conjunction with and/or by other components.

A delay line calibration operation may be performed at various times. Typically, the apparatus 100 will perform a calibration procedure when the associated circuit is powered-up. In addition, the apparatus 100 may perform a calibration procedure occasionally (e.g., periodically) or in response to some stimulus. For example, a calibration operation may be commenced when the apparatus 100 detects a change in temperature. Thus, the apparatus 100 may include a temperature sensor (not shown) that is used to determine whether there has been a change in temperature that exceeds a given threshold. The calibration may be performed when the circuit is non-operational or operational. In the latter case, provisions may be made to ensure that the calibration procedure does not significantly impact the operation of the associated circuit.

Initially (e.g., upon power-up), the delay of the delay line 102 may be set to a nominal or default value. In this case, the calibration operations discussed below may be performed to adjust the delay of the delay line to a desired value (e.g., to a value within a range of acceptable values).

Figure 2:
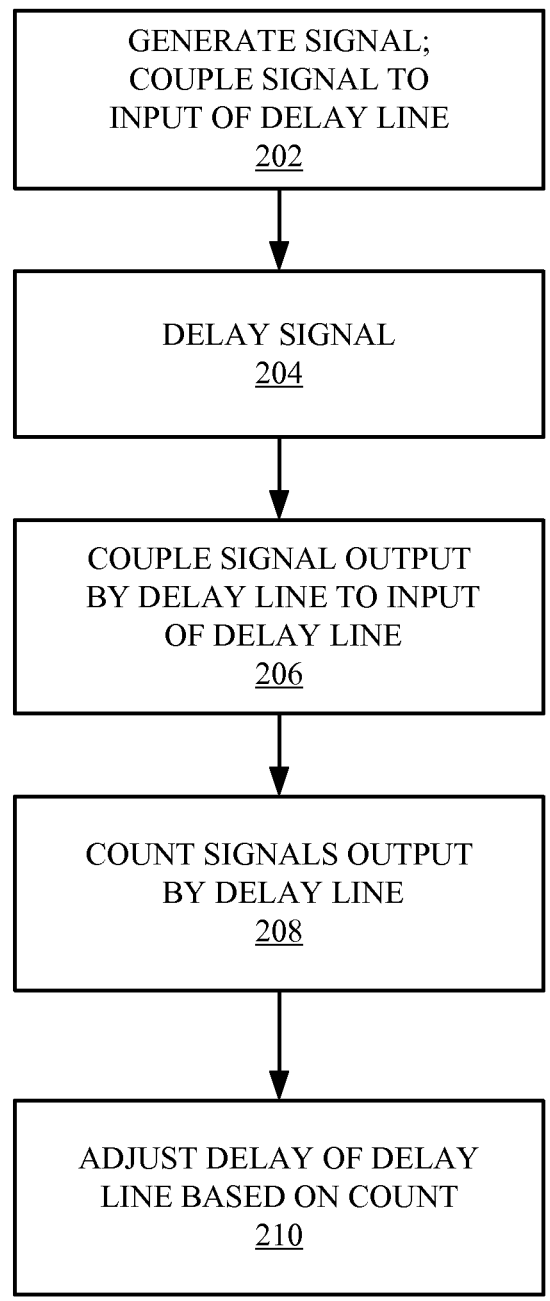
FIG. 2 is a flowchart of several exemplary aspects of operations that may be performed to calibrate a delay line.

As represented by block 202 in FIG. 2, the signal generator 104 generates a signal (as represented by a line 116) that is coupled to an input 118 of the delay line 102 via a coupler 120. As will be discussed in more detail below, the coupler 120 may comprise an adder, a logic gate or some other suitable coupling mechanism. As represented by block 204, the signal is thus delayed as it passes through the delay line 102.

An output 122 of the delay line 102 is coupled to the input 106 via the feedback path 118 including the coupler 120. Accordingly, after the signal from the signal generator 104 passes through the delay line 102, the signal will be fed back to the input 118 (block 206). The signal will thus be repeatedly delayed upon each pass through the delay line 102.

At block 208, the counter 110 increments a count every time the delay line 102 outputs a signal (as represented by a line 124). In other words, the counter 110 increments the count every time a signal completes a round-trip through the delay line 102 and the feedback path 112. Accordingly, each count represents a period of time corresponding to a delay of the delay line 102. The counter 110 provides the count to the controller 108 via a corresponding signal (as represented by the line 112).

As represented by block 210, the controller 108 uses the count 112 to determine whether the delay of the delay line 102 is within a range of desired values. Here, a comparator 126 may compare the count with the expected count and threshold 114 that define a range of acceptable values of the count. For example, the comparator 126 may determine the count difference between the count 112 and an expected count value. In the event this difference is greater than an acceptable amount (e.g., a threshold amount), the comparator may generate a signal indicating that the delay of the delay line 102 needs to be adjusted. In addition, the comparator 126 determines whether the count 112 is more than or less than an expected count value. Thus, the signal generated by the comparator 126 also may indicate that the delay of the delay line 102 needs to be increased or decreased (e.g., based on the count 112 being too high or too low, respectively).

Based on the signal from the comparator 126, the controller 108 adjusts a control signal (as represented by a line 128) that controls the delay of the delay line 102. In a typical implementation this involves adjusting the control signal 128 by a predefined step value that causes a corresponding incremental change $\Delta$ in the delay of the delay line 102. Accordingly, in the example of FIG. 1, a step control component 130 adjusts the magnitude of the control signal 128 (e.g., in a positive or negative direction) in step increments.

This change in the control signal 128 results in a corresponding incremental change $\Delta$ in the delay of the delay line 102. For example, a tunable delay line may comprise a filter with a tunable group delay implemented via switched capacitors or varactors. Alternatively, a tunable delay line may comprise a variable length transmission line, a sample and hold tapped delay line or some other tunable structure. The control signal 128 may thus interact with one or more of these components to, in effect, control the "length" of the delay line.

The operations of FIG. 2 may then be repeated as necessary until the delay of the delay line 102 is within the desired range. Here, the calibration procedure may be an iterative process that attempts to set the delay to an optimum value (e.g., a value that is least likely to fall outside the desired range over time).

In some aspects the controller 108 may adjust the control signal 128 in a manner that is based on the magnitude of the difference between the actual and desired delays of the delay line 102. For example, the step control component 130 may adjust the size of the step based on the magnitude of the difference between the count 112 and the expected count. Thus, in some cases, a change in the delay of the delay line 102 may be proportional to the delay error. In this way, the controller 108 may more quickly adjust the delay of the delay line 102 to an acceptable value through the use of a larger incremental change $\Delta$ in the delay.

In some aspects the controller 108 may control the operation of one or more components in FIG. 1 to ensure that the count 112 will be taken over a desired time period. Here, the controller 108 may include a timer 132 (clocked by, for example, a 10 MHz clock) that controls the operation of the counter 110 via a signal (as represented by a line 134). For example, the signal 134 may cause the counter 110 to commence counting at a certain point in time (e.g., by resetting the counter) and stop counting at another point in time (e.g., by disabling the counter). Alternatively, the controller 108 may use a signal from the timer 132 to determine when to compare the count 112 with the expected count/threshold 114. Also, based on a signal from the timer 132, the controller 108 may generate a signal (as represented by a line 136) to cause the signal generator 104 to generate the signal 116 at a specific time. For example, the signal generator 104 may generate the signal 116 at the beginning of a time interval for a counting operation.

An example of timing operations that may be used to set the delay line 102 to a target delay value D follows. Initially, the controller 108 may generate the signal 136 at time T0 to cause the signal generator 104 to generate a single pulse signal 116. The counter 110 then counts the number of pulse signals N output by the delay line 102 in T seconds (e.g., 1 μs). If |N−T/D|<Threshold 114 (e.g., 100 counts), the delay line 102 is deemed to be tuned and the calibration procedure is terminated. Advantageously, a signal may be routed through a delay line multiple times such that small variations in delay are built up to large measurable differences to enable more precise calibration of the delay line.

Otherwise, the controller 108 compares the number of pulse signals N output by the delay line in T seconds to the expected number of pulse signals T/D corresponding to the desired delay. If N>T/D, controller 108 increases the delay by a step amount $\Delta$. If N<T/D, the controller 108 decreases the delay by a step amount $\Delta$. Otherwise, the controller 108 does not change the delay. The calibration process may then be repeated until the delay of the delay line 102 is within a desired range around D.

As will be discussed in more detail below, in a typical implementation the delay line 102 will delay signals for a specific circuit of a device (not shown in FIG. 1). Accordingly, a coupling mechanism (e.g., one or more switches such as transistors, not shown in FIG. 1) may be provided for coupling and/or decoupling various components of the apparatus 100 and the circuit to/from the delay line 102. In this way, the delay line 102 may be readily switched between a configuration that enables the delay line 102 to be calibrated and a configuration where the delay line 102 delays signals for the circuit. In particular, the feedback path 106 may include a mechanism (e.g., a switch such as a transistor, not shown in FIG. 1) to decouple the output 122 and input 118 of the delay line 102.

Figure 3:
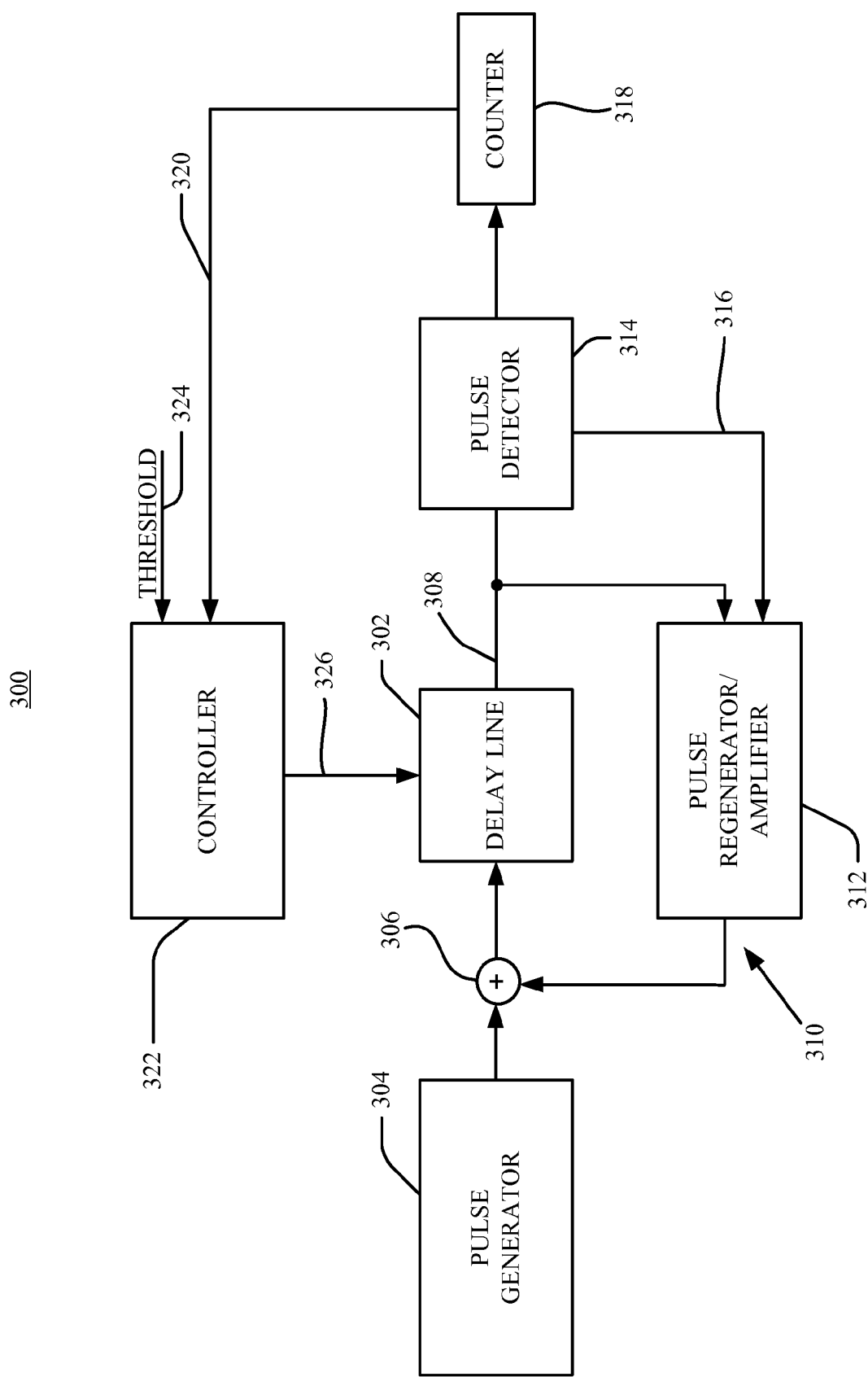
FIG. 3 is a simplified block diagram of several exemplary aspects of an apparatus that calibrates a delay line by counting pulse signals fed back through the delay line.
Figure 4:
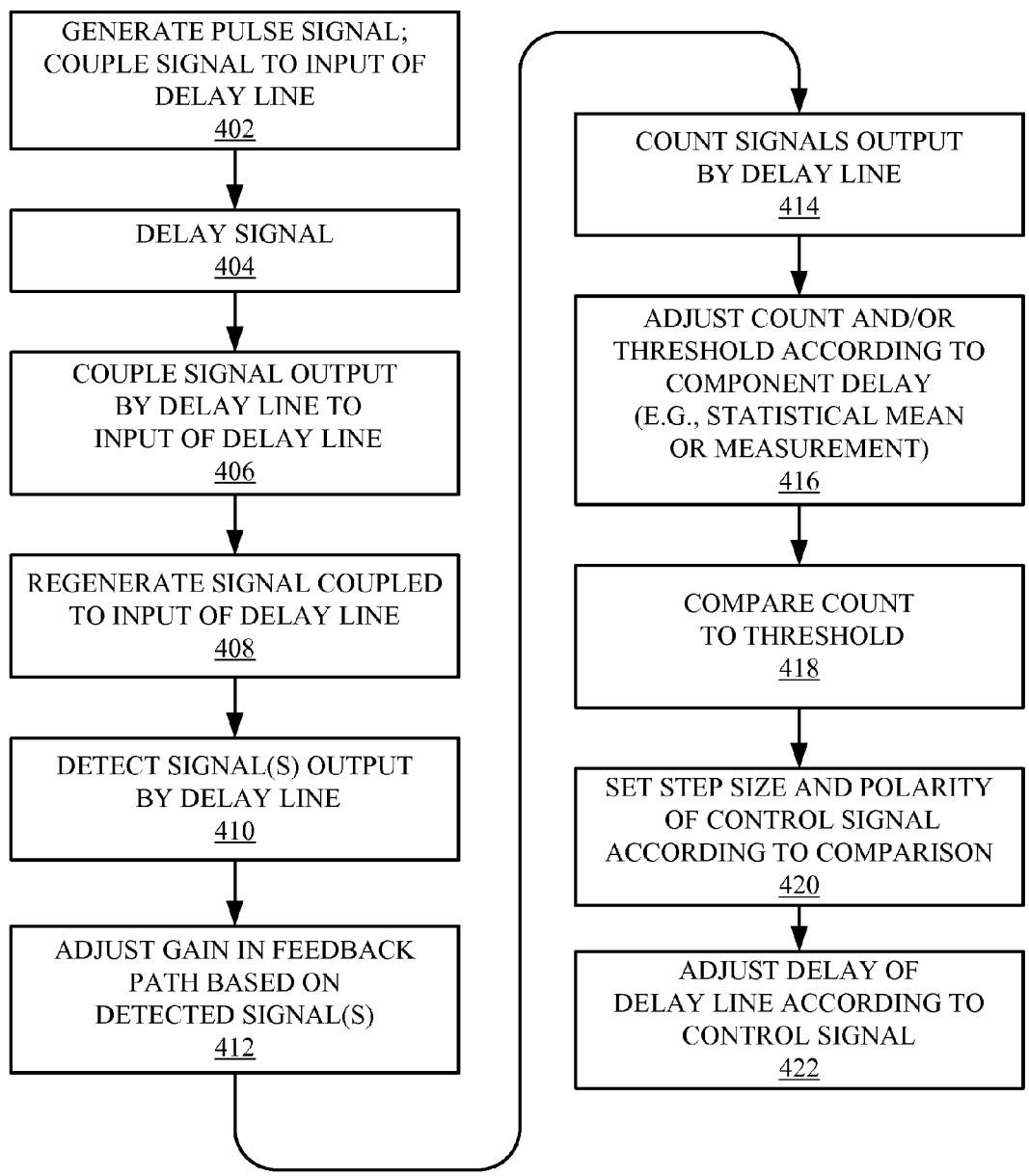
FIG. 4 is a flowchart of several exemplary aspects of operations that may be performed to calibrate a delay line.

Referring now to FIGS. 3 and 4, additional details of an apparatus and method for calibrating a delay line will be treated in the context of an apparatus that counts pulse signals that are fed through a delay line. Specifically, FIG. 3 illustrates certain aspects of an apparatus 300 for calibrating a delay line 302. FIG. 4 illustrates certain aspects of operations that may be performed to calibrate a delay line.

As represented by block 402 of FIG. 4, a pulse generator 304 generates a pulse signal that is coupled to an input of the delay line 302 via an adder 306. The delay line 302 delays the pulse signal (block 404) and outputs the delayed pulse signal as represented by the line 308.

As represented by block 406, a feedback path 310 including the adder 306 couples the pulse signal 308 back to the input of the delay line 302. In some aspects the feedback path 310 may optionally include one or more components 312 that compensate for distortion that may be imparted upon the pulse signal as it is repeatedly routed through the loop defined by the delay line 302 and the feedback path 310. For example, the component 312 may incorporate a pulse regenerator and/or an amplifier.

The pulse regenerator may be used, for example, to reshape the pulse signal to compensate for any distortion of the shape of the pulse signal (e.g., smearing or amplitude uncertainty) caused by repeated passes through the loop (block 408). In some cases such reshaping may help maintain the stability of the loop. A pulse regenerator may take various forms such as, for example, a matched filter. Here, however, provisions may need to be taken to ensure that the delay imparted on a signal by the pulse regenerator does not adversely affect the calibration procedure to a significant extent.

The amplifier may be used to provide gain for the feedback path 310 to compensate for any change in the amplitude of the pulse signal caused by repeated passes through the loop. In some implementations the apparatus 300 may automatically compensate for any change in the amplitude of the pulse signal. For example, if the amplifier gain is too low, the pulse signal will decay as it is repeatedly fed through the loop. Thus, eventually, the pulse detector 314 may not be able to detect the signal. On the other hand, if the gain is too high, the pulse signal and noise may be amplified to saturation. Again, the pulse detector 314 may not be able to detect the pulse signals.

Accordingly, in some aspects the apparatus 300 may calibrate the gain in feedback path. As an example, an optional pulse detector 314 may detect one or more of the pulse signals 308 output by the delay line 302 to determine whether the pulse signals routed through the loop are being distorted (block 410). For example, the pulse detector 314 may detect the pulse signal strength after a given number of iterations (e.g., 1000 iterations). If the pulse amplitude is too high or saturated, the gain is decreased. If the pulse amplitude is too low, the gain is increased. To this end, the pulse detector 314 may generate a signal (as represented by the line 316) that controls the gain of the amplifier and/or controls some other characteristic of the component 312 (block 412). This procedure is repeated until the pulse amplitude is within an acceptable tolerance.

In some aspects the gain may be dynamically adjusted while the delay line calibration is in progress. For example, if a function of the previous pulse amplitudes was too large or too small, the gain may be decreased or increased, respectively. The function may relate to the last pulse signal, a windowed average of the last several pulse signals, a weighted filter of the previous pulse signals, or any suitable linear or non-linear function relating to one or more pulse signals.

The pulse detector 314 may be implemented in various ways. For example, in some aspects the pulse detector 314 may comprise an amplitude detector that detects amplitude of the pulse signal(s). In some aspects the pulse detector 314 may comprise a matched filter that is adapted to match the expected characteristics of the signal(s) being detected. Such an implementation may provide better rejection of noise that may, in the case of a simple peak detector, trigger a false detection.

As represented by block 414, a counter 318 counts each pulse signal 308 output by the delay line 302. In a similar manner as discussed above in conjunction with FIG. 1, the counter 318 provides a resulting count 320 to a controller 322.

As represented by block 416, provisions may be made to account for delays in the feedback path 310. For example, the adder 306 and the component 312 may impart some delay on any pulse signal that passes through these components. In the event this delay is not insubstantial in comparison with the delay of the delay line 302, it may be desirable to compensate for this delay when determining whether the delay of the delay line 302 is at an acceptable delay value. In some aspects a count 320 generated by the counter may be adjusted (e.g., decremented) to account for any component delays that are not attributable to the delay line 302. In some aspects an expected count and/or a threshold 324 may be adjusted (e.g., incremented) to account for the component delays.

Various techniques may be employed to obtain a component delay value. For example, a delay of a specific component or a specific type of component may be measured after the component has been manufactured. Alternatively, a delay of a component may be calculated or estimated. For example, a mean of the component delay may be statistically calculated or estimated based on analysis of the component or multiple samples of components. In either case, the apparatus 300 may include a data memory into which offset values indicative of the statistical mean of the delay, the measured delay or some other parameter may be programmed for use in the calibration procedure.

As represented by block 418, the controller 322 compares the count 322 to the expected count/threshold 324 (and/or some other suitable baseline) to determine whether the delay of the delay line 302 is acceptable. As represented by block 420, if the delay is not acceptable, the controller 322 will adjust a control signal (as represented by a line 326) based on the comparison. For example, as discussed above in conjunction with FIG. 1, the controller 322 may increase or decrease the magnitude and/or polarity of the control signal 326 on an incremental basis. In addition, the controller 322 may adjust the step size based on the results of the comparison. The controller 322 will then provide the resulting control signal 326 to the delay line 302 to adjust the delay (block 422).

Depending upon the requirements of a given application, the pulse generator 304 may generate various forms of pulse signals. In general, the width of a pulse signal may be less than a time period of the delay of the delay line 302. In this way, a second transition of the pulse signal may be input into the delay line 302 before a first transition of the pulse signal is fed from the output of the delay line 302 back to the input of the delay line 302.

In some aspects the pulse generator 304 may generate several pulse signals that may be concurrently routed through the feedback path. To ensure that these pulse signals are orthogonal, the time between the first pulse signal and the last pulse signal may be less than a time period of the delay of the delay line 302. Alternatively, other provisions may be made to reduce the possibility or effect of "collisions" of the pulse signals. For example, the pulse signals may be spaced in time to avoid collisions. Alternatively, the likelihood of collisions may be estimated and factored into one or more of the counter's count, the expected count or the threshold. A potential advantage of the use of multiple pulse signals is that a given count may be reached more quickly. Thus, less time may be required and less power may be used to perform the calibration operation. Another potential advantage of the use of multiple pulse signals is that any adverse effect of pulse detection errors due to noise or distortion may be reduced since a larger number of pulse signals may be processed in a given amount of time.

Figure 5:
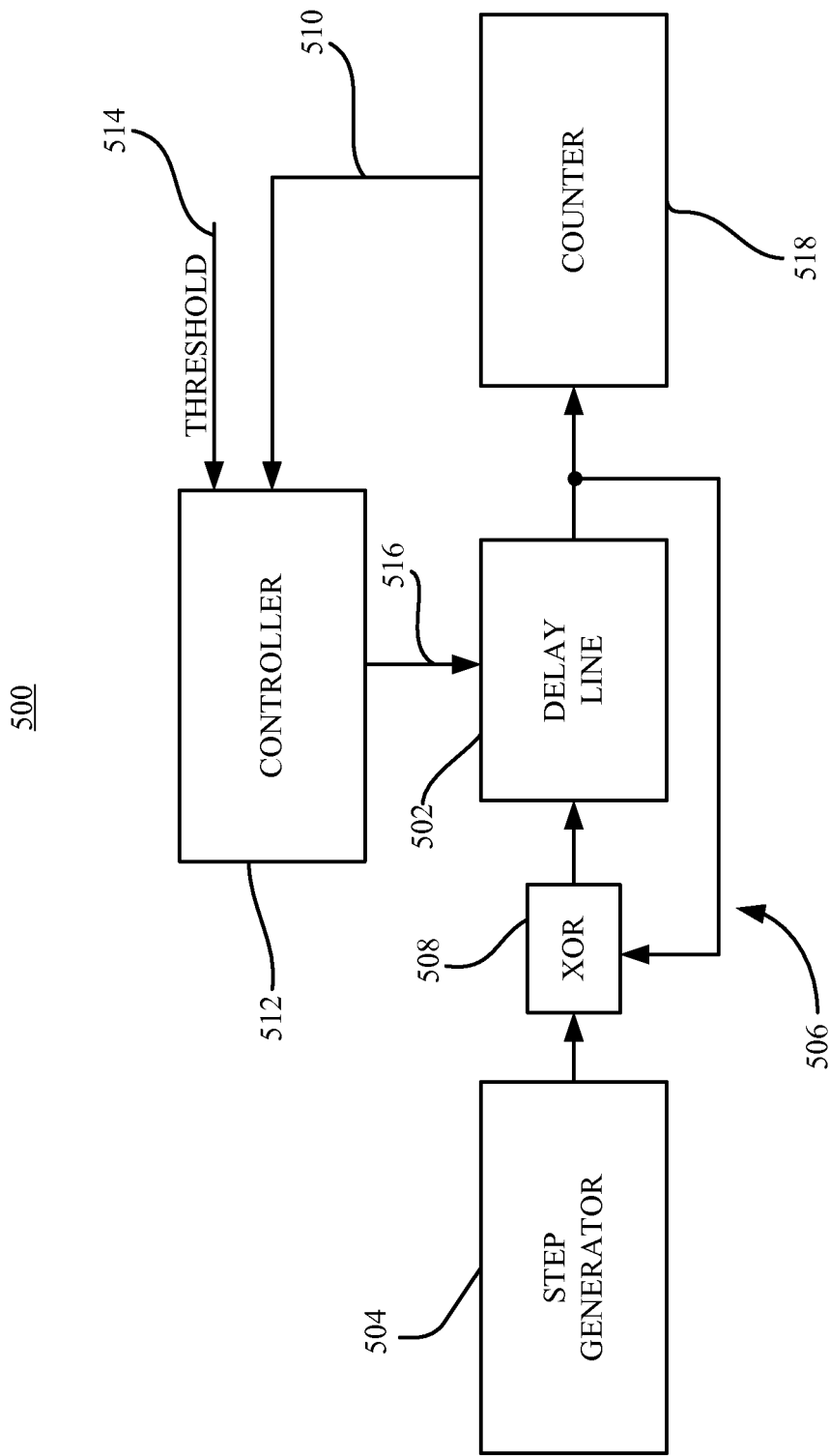
FIG. 5 is a simplified block diagram of several exemplary aspects of an apparatus that uses a digital feedback signal to calibrate a delay line.
Figure 6:
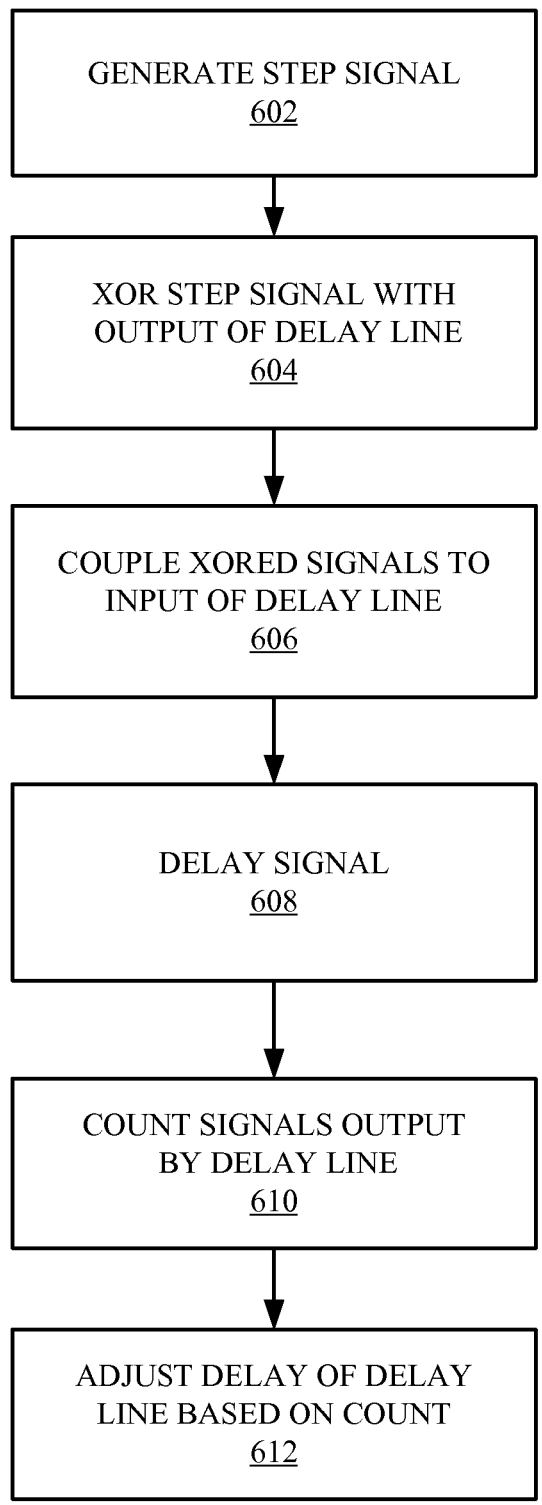
FIG. 6 is a flowchart of several exemplary aspects of operations that may be performed to calibrate a delay line using a digital feedback signal.

Referring now to FIGS. 5 and 6, additional details of an apparatus and method for calibrating a delay line will be treated in the context of an apparatus that repeatedly feeds a digital signal through a delay line. FIG. 5 illustrates certain aspects of an apparatus 500 for calibrating a delay line 502. FIG. 6 illustrates certain aspects of operations that may be performed to calibrate a delay line.

As represented by block 602 of FIG. 6, a step generator 504 generates a step signal that is to be provided to the delay line 502. In this case, as represented by block 604, a feedback path 506 incorporating an XOR gate 508 couples the step signal with a signal output by the delay line 502 (block 604) and provides the result to an input of the delay line 502 (block 606). That is, the output of the XOR gate 508 depends on the current value of the step signal and the current value of the output of the delay line 502. Here, regardless of the initial state of the output signal of the delay line 502, once the step signal transitions (from a low to a high state or a high to a low state), the output of the XOR gate 508 will change (from high to low or low to high). Moreover, after the delay line 502 delays the signal (block 608) and outputs the delayed signal, the resulting change in the output signal of the delay line 502 will also cause a corresponding change in the output of the XOR gate 508.

Accordingly, it should be appreciated that a digital signal will, in effect, be continually fed through the feedback loop 506 and the delay line 502. As an example, when the delay of the delay line 502 is 10 ns, the XOR gate will output a signal having a frequency on the order of 50 MHz. Moreover, the shape of this signal may be maintained regardless of the number of signals output by the delay line 502 since the XOR gate inherently provides gain and reshaping of the edges of the signal. Thus, through the use of a digital signal and associated digital components, the apparatus 500 may provide a relatively stable calibration operation without the use of additional components that compensate for distortion of the signal, for example, as discussed above in conjunction with FIG. 1.

As represented by block 610, a counter 518 counts each signal (e.g., via a rising edge and/or a falling edge of the signal) output by the delay line 502. The counter 518 then provides a resulting count 510 to a controller 512.

The controller 512 compares the count 510 with an expected count and/or a threshold 514 (or some other suitable baseline) to determine whether the delay of the delay line 502 is acceptable. If the delay is not acceptable, the controller 512 will generate an appropriate control signal 516 to adjust the delay based on the comparison (block 612).

Figure 7:
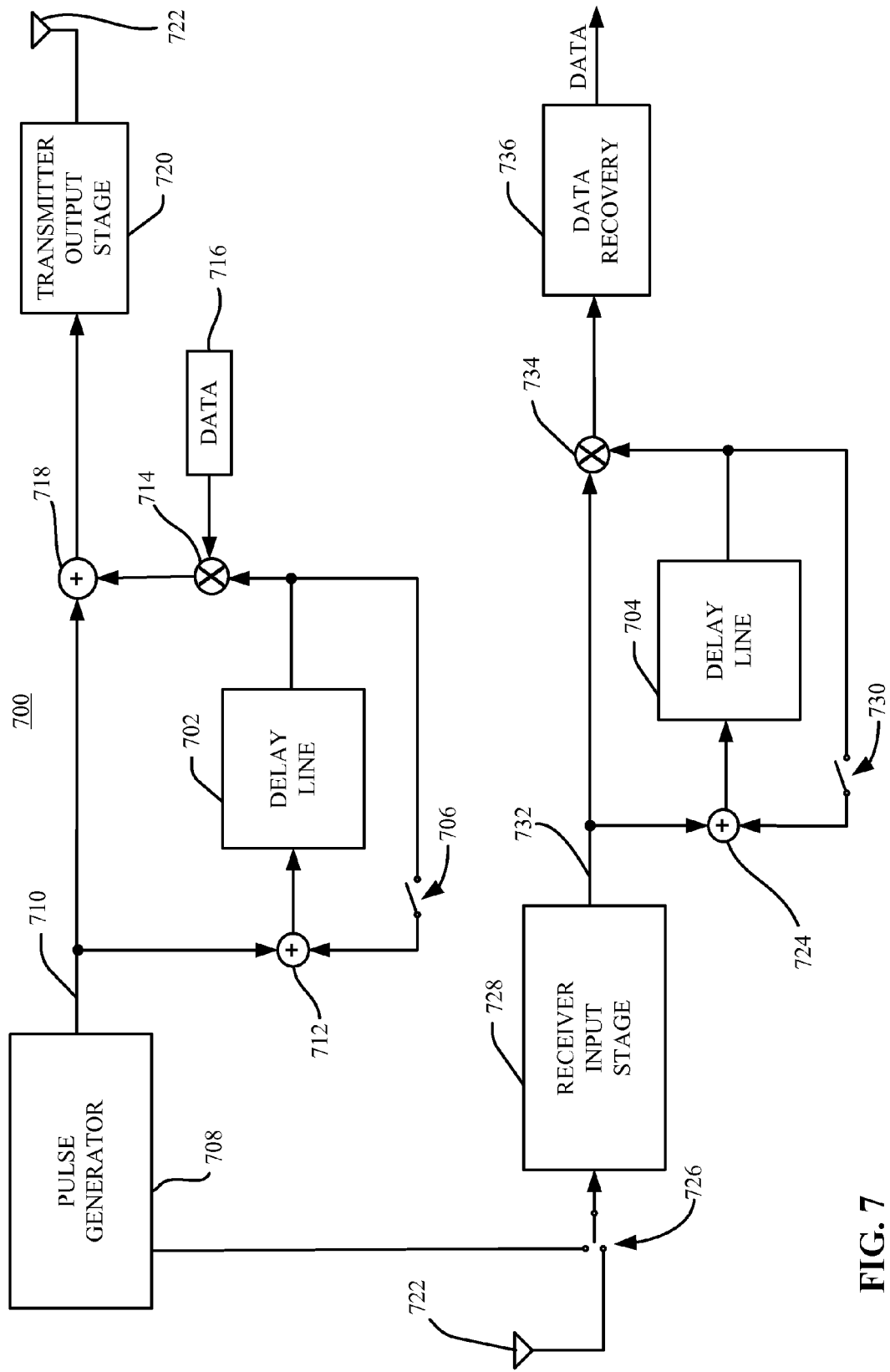
FIG. 7 is a simplified diagram of several exemplary aspects of a transmitted reference system.

As discussed above, in practice a delay line is incorporated into a circuit to impart a delay on signals in the circuit. FIG. 7 illustrates several aspects of an exemplary transmitted reference system 700 that incorporates a tunable delay line as taught herein. In some aspects a transmitter reference signaling technique may be used in an ultra-wideband system to provide, for example, a personal area network or a body area network. To reduce the complexity of FIG. 7, various aspects of the associated apparatus for calibrating a delay line (e.g., a counter and a controller) are not shown. It should be understood, however, that these aspects may be incorporated into the system 700.

The transmitted reference system 700 includes a transmitter section (top half of FIG. 7) and receiver section (bottom half of FIG. 7). In the example of FIG. 7, the transmitter section includes a delay line 702 and the receiver section includes a delay line 704. Exemplary operations of each of these sections will be discussed in conjunction with the flowcharts of FIGS. 8 and 9.

Figure 8:
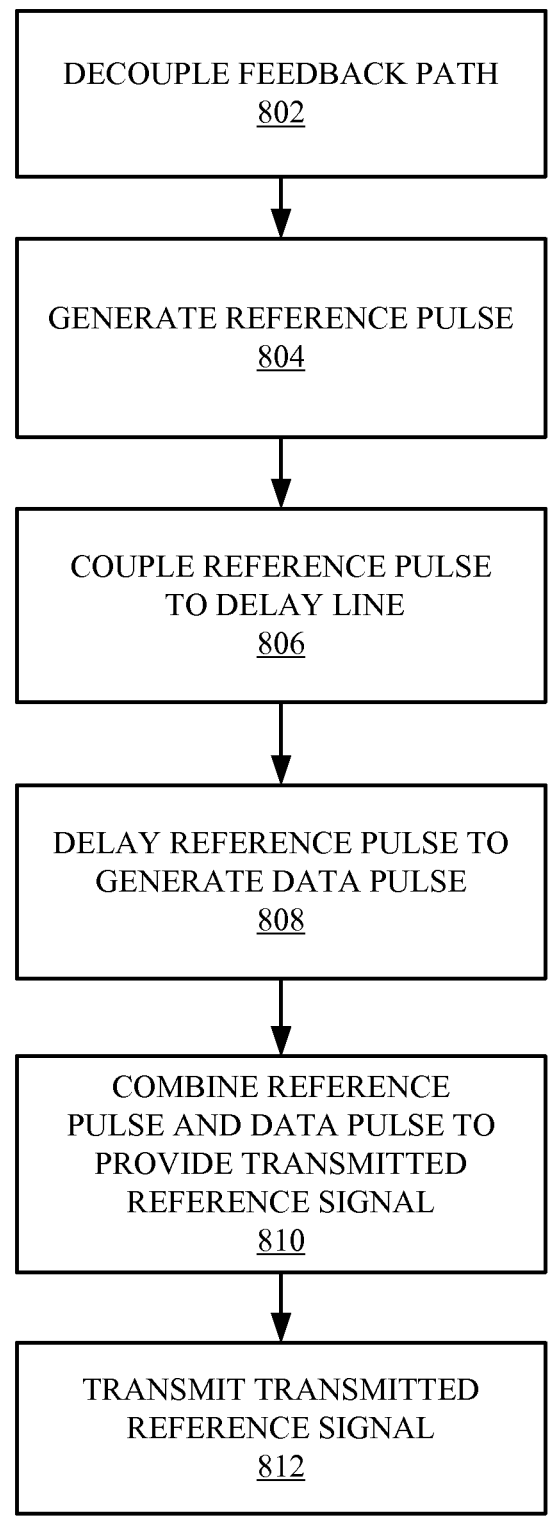
FIG. 8 is a flowchart of several exemplary aspects of operations that may be performed to transmit a transmitted reference signal.

As represented by block 802 in FIG. 8, after the delay line 702 is calibrated as discussed herein, the feedback path used during calibration of the delay line 702 may be decoupled. For example, a switch (e.g., a transistor or some other suitable component) 706 may be opened in the feedback path to prevent an output of the delay line 702 from being fed back to an input of the delay line 702.

As represented by block 804, a pulse generator 708 generates a reference pulse that is coupled (as represented by a line 710) to the delay line 702 via an adder 712 (block 806). In this example, during the calibration operation the pulse generator 708 and the adder 712 may have performed similar functions as the pulse generator 304 and the adder 306 of FIG. 3. As represented by block 808, the delayed reference pulse output by the delay line 702 is used (e.g., by a multiplier 714) to generate a data pulse based on a corresponding data bit 716.

As represented by block 810, the reference pulse generated at block 804 and the data pulse generated at block 808 are, in effect, combined (e.g. via adder 718) to provide a transmitted reference signal. Here, the reference pulse will precede the data pulse by a given amount of time as determined by the delay of the delay line 702.

The delay line 702 thus provides a desired delay between the reference pulse and the data pulse when encoding a transmitted reference signal. Advantageously, through the use of delay line calibration techniques as taught herein, the delay of the delay line 702 may be set and maintained with a high level of precision and accuracy regardless of any process variations, temperature variations or other conditions that may otherwise affect the delay of the delay line 702.

In some aspects, the delay imparted by a delay line may be configurable. For example, a different delay may be specified for different communication channels. In addition, the delay between different sets of reference and data pulses may change dynamically (e.g., in accordance with a known hopping sequence). In such cases, a calibration mechanism as taught herein may likewise be configurable to calibrate the different values of delay for the delay line and/or to calibrate the delay line to provide an optimum delay value or set of delay values.

As represented by block 812, a transmitter output stage 720 processes (e.g., filters and amplifies) the transmitted reference signal and provides the signal to an antenna 722 for transmission.

Figure 9:
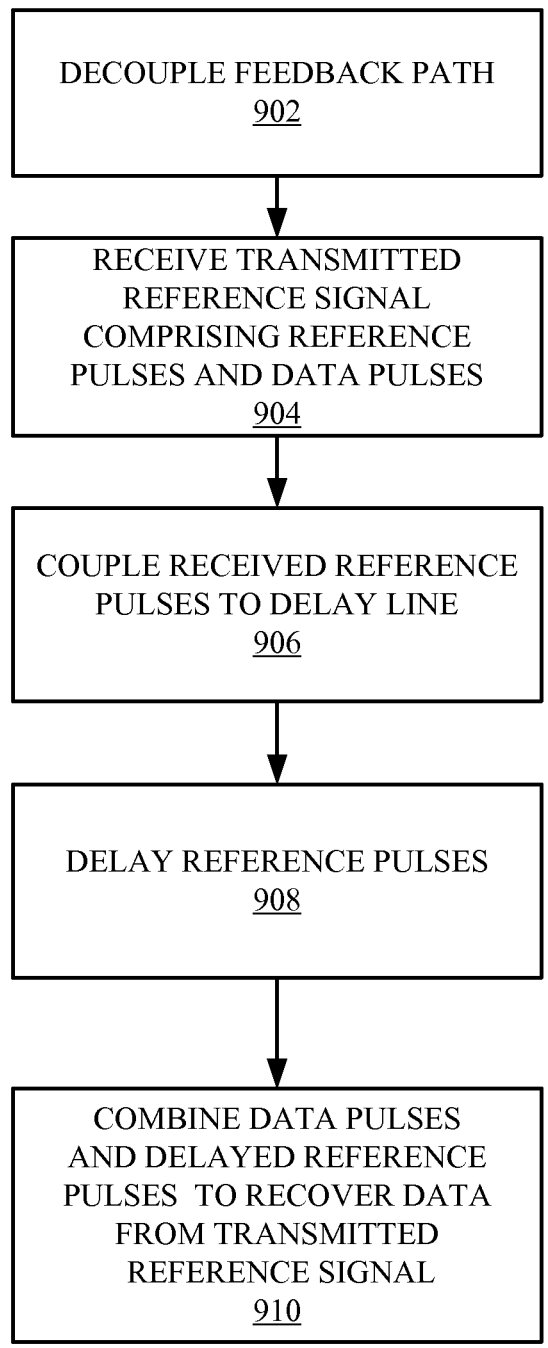
FIG. 9 is a flowchart of several exemplary aspects of operations that may be performed to receive a transmitted reference signal.

Exemplary operations of the receiver section of the system 700 will now be treated in conjunction with the operations of FIG. 9. In the example of FIG. 7, the pulse generator 708 may be used to generate pulse signals for calibration of the delay line 704. Thus, during the calibration operation the pulse generator 708 and an adder 724 may have performed similar functions as the pulse generator 304 and the adder 306 of FIG. 3. In this case, the system 700 may include a switch 726 that selectively couples an input stage 728 of the receiver to either the output of the pulse generator 708 or to the antenna 722. In this way, the receiver input stage 728 may receive a pulse from the pulse generator 708 during calibration operations or receive signals from the antenna 722 during normal operations.

As represented by block 902 and FIG. 9, after the delay line 704 is calibrated as discussed herein, the feedback path used during calibration of the delay line 704 may be decoupled. For example, a switch 730 may be opened in the feedback path to prevent an output of the delay line 704 from being fed back to an input of the delay line 704.

As represented by block 904, during normal operations the receiver input stage 728 may receive a transmitted reference signal via the antenna 722. As discussed above, a transmitted reference signal consists of a series of reference and data pulses. The receiver input stage 728 may perform various operations including, for example, amplifying and filtering.

As represented by block 906, the reference pulse of a given reference and data pulse pair is coupled (as represented by a line 732) to the input of the delay line 704. In this way, the reference pulse may be delayed an amount of time that is equal to a time period between the reference pulse and the corresponding data pulse (block 908). The delay line 704 thus provides, with precision, a desired delay between the reference pulse and the data pulse for decoding a transmitted reference signal.

As represented by block 910, the delayed reference pulse may be combined (e.g., via a multiplier 734) with the corresponding data pulse. This operation may, in effect, provide the functionality of a matched filter to efficiently extract the data information from the received data pulse. The resulting pulse may then be provided to a data recovery component 736 that may further process (e.g., amplifying and filter) the pulse to recover data from the transmitted reference signal.

Figure 10:
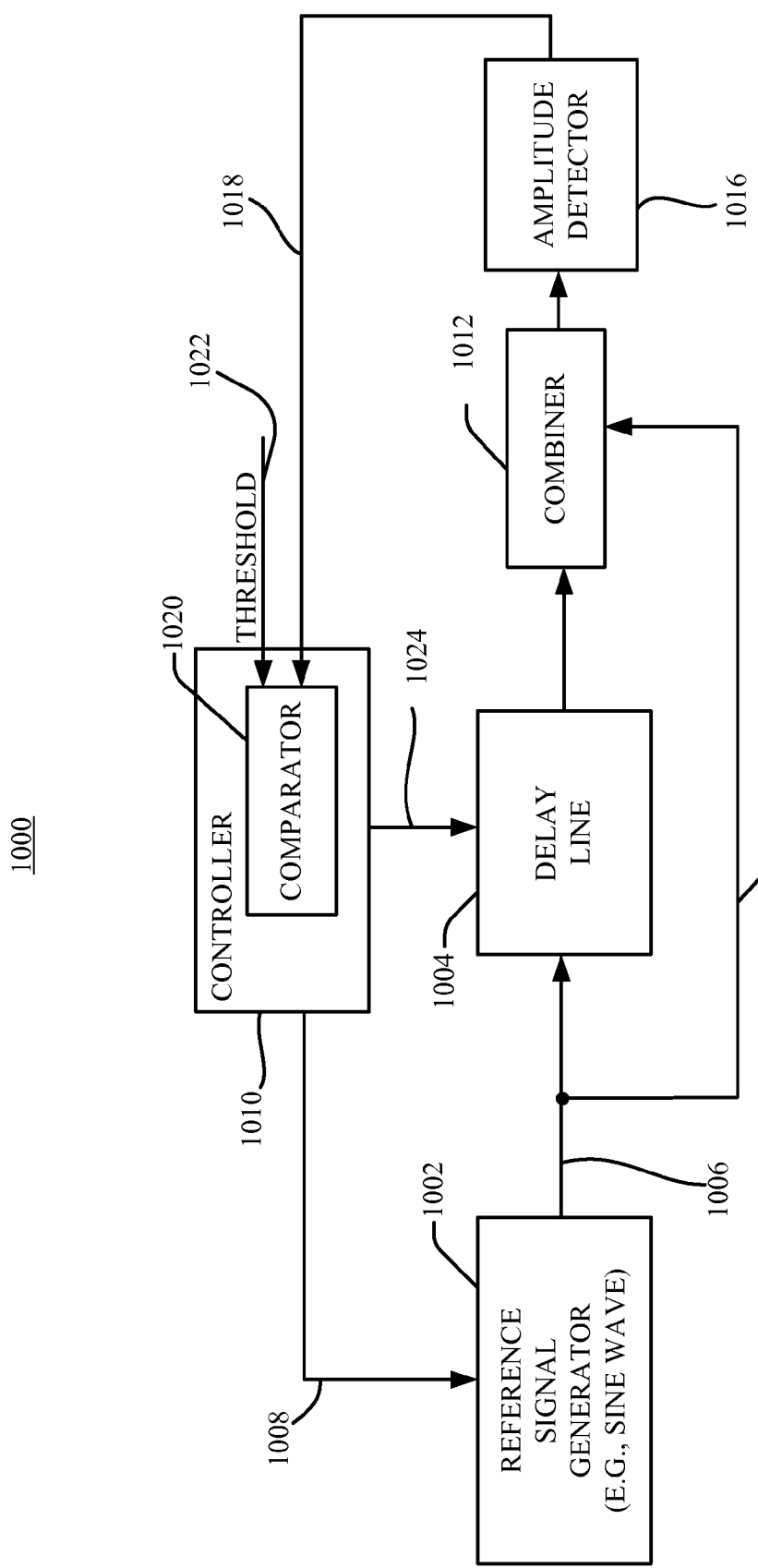
FIG. 10 is a simplified block diagram of several exemplary aspects of an apparatus that calibrates a delay line by combining a reference signal and a delayed reference signal.
Figure 11:
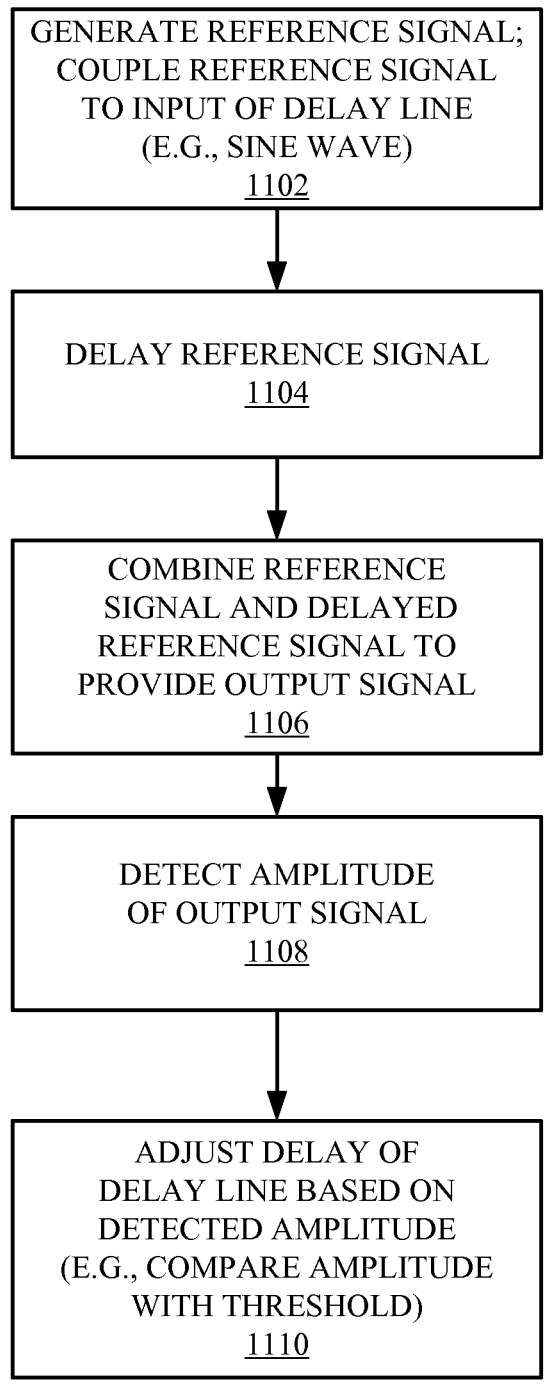
FIG. 11 is a flowchart of several exemplary aspects of operations that may be performed to calibrate a delay line by combining a reference signal and a delayed reference signal.

Referring now to FIGS. 10 and 11, in some aspects an apparatus and a method for calibrating a delay line may combine a reference signal and a delayed reference signal to generate an indication of the delay of the delay line. Here, a feedforward mechanism may be employed to facilitate combining the reference signal and the delayed reference signal. The amplitude of the combined signal may then be used to provide an indication as to the actual delay of the delay line.

As represented by block 1102 in FIG. 11, a reference signal generator 1002 generates a reference signal (as represented by a line 1006) that is coupled to an input of a delay line 1004. In some aspects the reference signal 1006 may comprise a continuous wave signal providing, for example, a sine function, a cosine function or some other suitable waveform. The signal generator 1002 may commence and terminate generation of the reference signal 1006 in accordance with a control signal 1008 received from, for example, the controller 1010. As represented by block 1104, the delay line 1004 delays the reference signal 1006 and provides the delayed reference signal to an input of a combiner 1012.

As represented by block 1106, the combiner 1012 combines the reference signal provided via a feedforward path 1014 and the delayed reference signal. The combiner 1012 may comprise a comparator, an arithmetic unit such as a summer (adder), a subtracter or some other suitable combining mechanism. Here, the signal output by the combiner 1012 has a phase shift due to the delay line 1004. Moreover, this phase shift affects the amplitude (e.g., the peak value) of the output signal.

Accordingly, as represented by block 1108, the combiner 1012 provides the combined signal to an amplitude detector 1016. In some aspects the amplitude detector 1016 may comprise a peak detector adapted to detect the peaks of the combined signal. For example, in the case where the reference signal is a sine wave, the delay line creates a phase shift in the sin wave of $\phi=\omega*D$, where $\omega$ is the sine wave frequency in radians, and D is the delay of the delay line 1004, in seconds. In the case where the combiner 1012 is a summer, the output of the summer 1012 is $\sin(\omega t)+\sin(w\omega+\phi)=2\sin(\omega t+\phi/2)\cos(\phi/2)$. The peak detector 1016 detects the peak over time which is $2\cos(\phi/2)$. Alternatively, in the case where the combiner 1012 is a subtracter, the peak over time detected by the peak detector 1016 is $2\sin(\phi/2)$. As represented by a line 1018, the amplitude detector 1016 provides the detected value (e.g., the peak value) to the controller 1010.

As represented by block 1110, the controller 1010 adjusts the delay with the delay line 1004 based on the detected value 1018. For example, a comparator 1020 may compare an amplitude 1018 (e.g., a peak value) provided by the amplitude detector 1016 with a threshold 1022. If the amplitude 1018 is a more than or less than the threshold 1022 (or within a certain range of the threshold 1022), the controller 1010 may generate an appropriate control signal 1024 as discussed herein to increase or decrease the delay of the delay line 1004.

In a similar manner as discussed above, in a typical implementation the delay line 1004 will delay signals for a specific circuit of a device (not shown in FIG. 10). Accordingly, a coupling mechanism (e.g., one or more switches, not shown in FIG. 10) may be provided for coupling and/or decoupling various components of the apparatus 1000 and the circuit to/from the delay line 1004.

The teachings herein may be incorporated into a variety of devices. For example, one or more aspects taught herein may be incorporated into a phone (e.g., a cellular phone), a personal data assistant ("PDA"), an entertainment device (e.g., a music or video device), a headset, a microphone, a biometric sensor (e.g., a heart rate monitor, a pedometer, an EKG device, etc.), a user I/O device (e.g., a watch, a remote control, etc.), a tire pressure gauge or any other suitable device. Moreover, these devices may have different power and data requirements. Advantageously, the teachings herein may be adapted for use in low power applications (e.g., that use a pulse-based signaling scheme) and at a variety of data rates including relatively high data rates (e.g., in applications that use high-bandwidth pulses).

Figure 12:
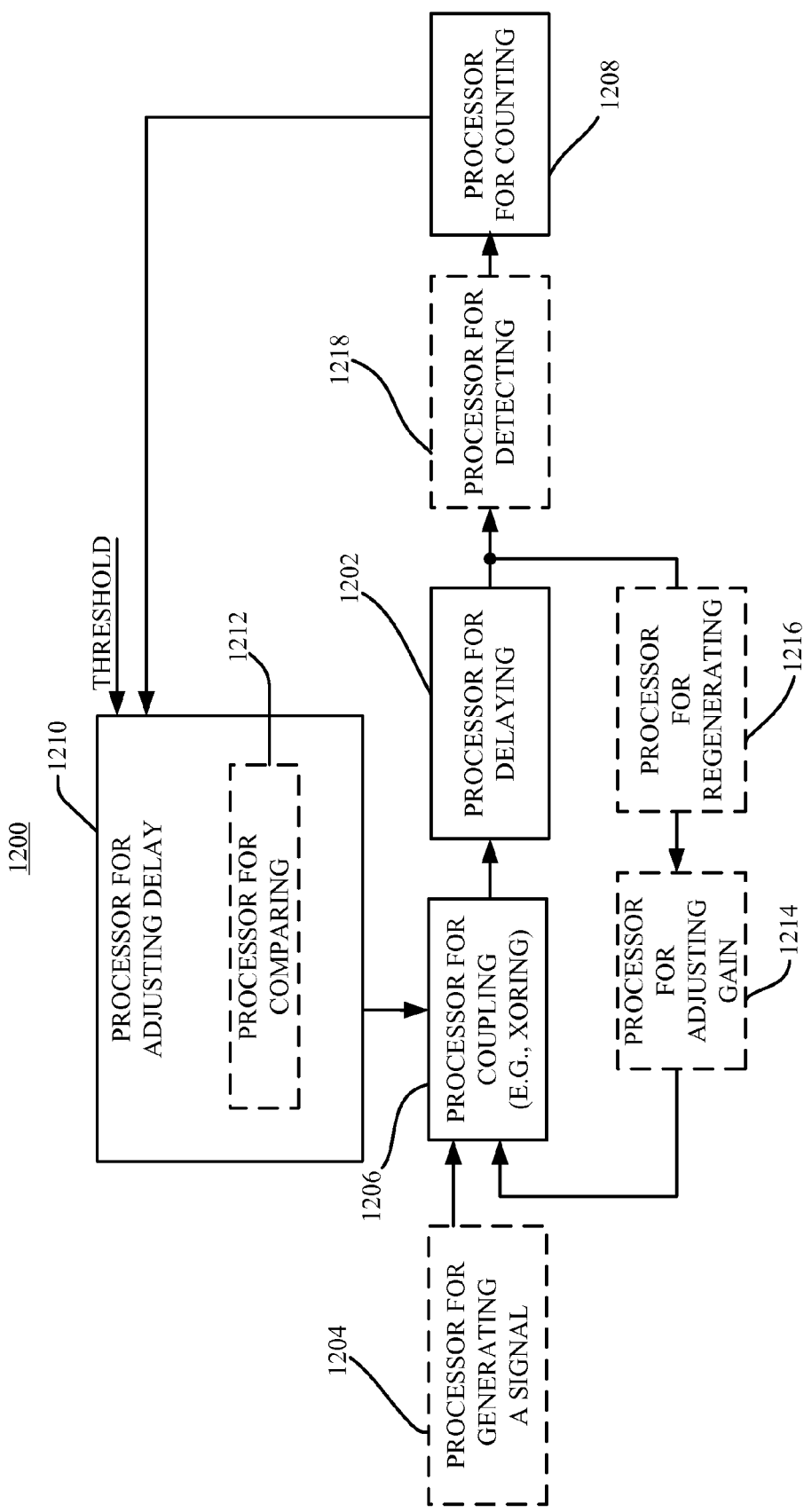
FIG. 12 is a simplified block diagram of several exemplary aspects of an apparatus that uses feedback to calibrate a delay line.
Figure 13:
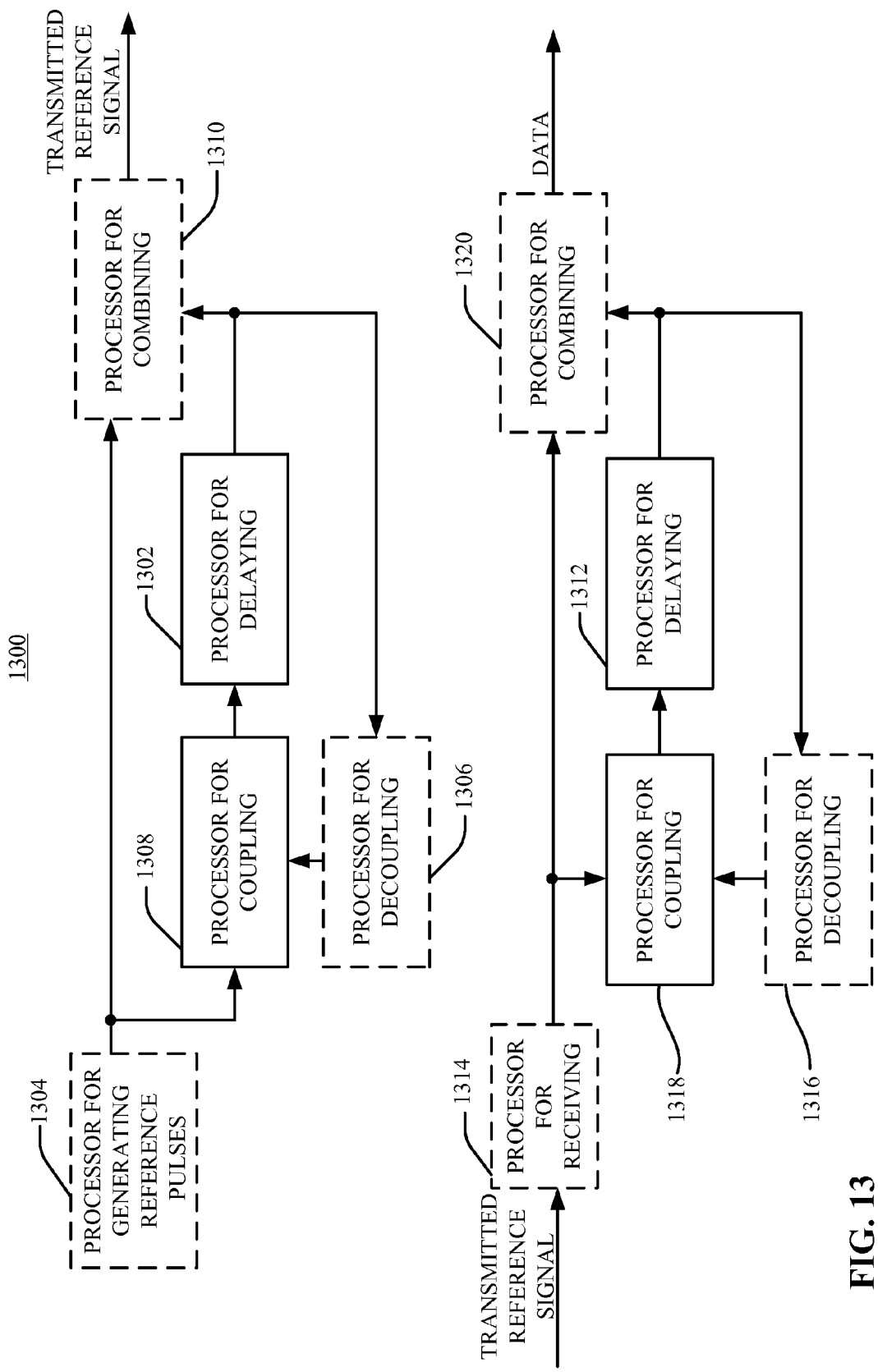
FIG. 13 is a simplified diagram of several exemplary aspects of a transmitted reference system.
Figure 14:
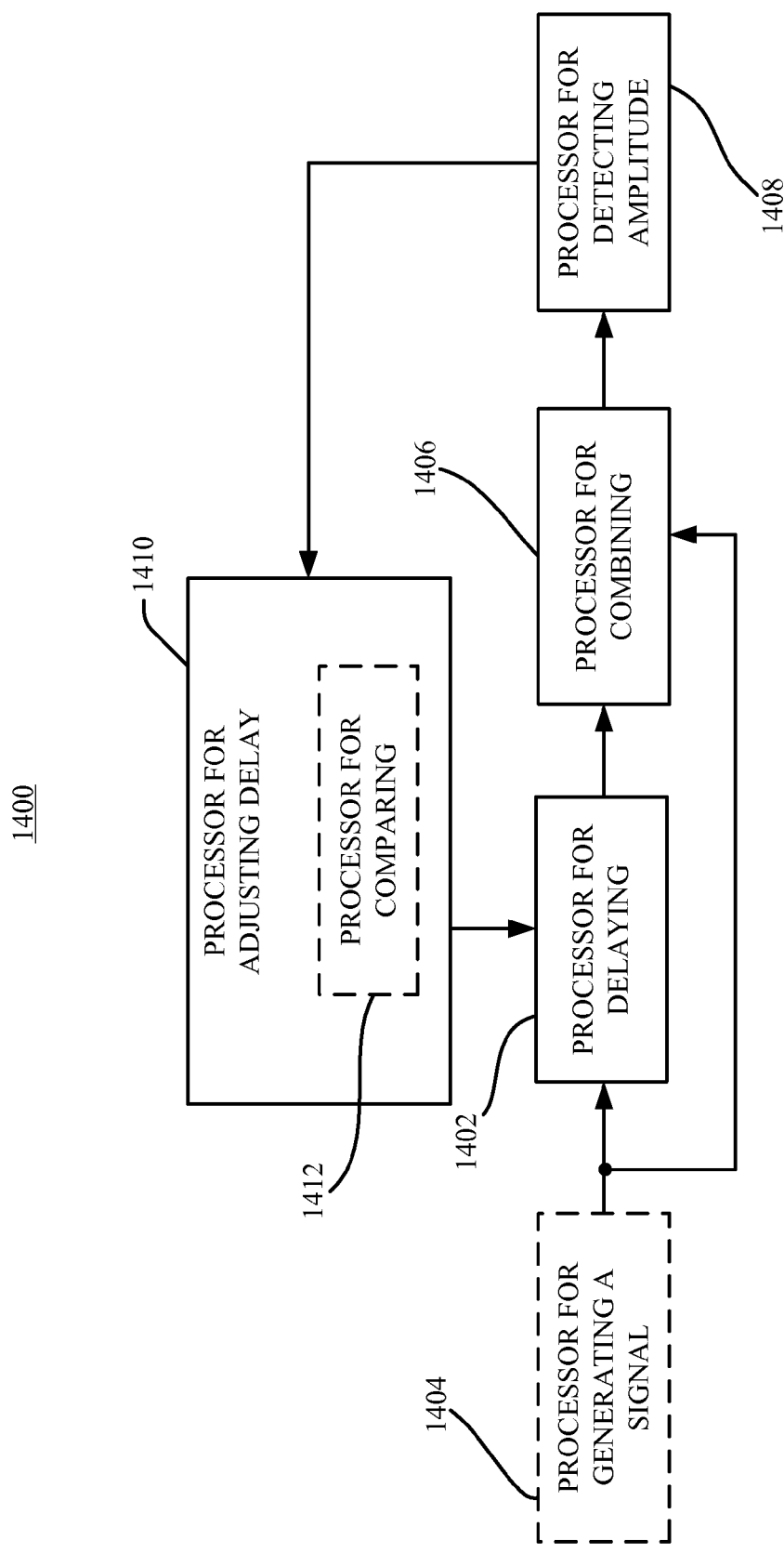
FIG. 14 is a simplified block diagram of several exemplary aspects of an apparatus that calibrates a delay line by combining a signal and a delayed signal.

The components described herein may be implemented in a variety of ways. For example, referring to FIG. 12, an apparatus 1200 includes components 1202, 1204, 1206, 1208, 1210, 1212, 1214, 1216 and 1218 that may correspond to similar components in FIGS. 1, 3 and 5. In FIG. 13 an apparatus 1300 includes components 1302, 1304, 1306, 1308, 1310, 1312, 1314, 1316, 1318 and 1320 that may correspond to similar components in FIG. 7. In FIG. 14 an apparatus 1400 includes components 1402, 1404, 1406, 1408, 1410 and 1412 that may correspond to similar components in FIG. 10. FIGS. 12, 13 and 14 illustrate that in some aspects these components may be implemented via appropriate processor components. These processor components may in some aspects be implemented, at least in part, using structure as taught herein. In some aspects a processor may be adapted to implement a portion or all of the functionality of one or more of these components. In some aspects the components represented by dashed boxes are optional.

In addition, the components and functions described herein may be implemented using any suitable means. Such means also may be implemented, at least in part, using corresponding structure as taught herein. In particular, one or more of such means may be implemented to provide similar functionality as one or more of the processor components of FIGS. 12, 13 and 14. For example, in some aspects means for delaying may comprise a delay line, means for generating a signal may comprise a signal generator, means for coupling may comprise a coupler, means for counting may comprise a counter, means for adjusting delay may comprise a controller, means for comparing may comprise a comparator, means for adjusting gain may comprise an amplifier, means for regenerating may comprise a regenerator, means for detecting may comprise a detector, means for generating reference pulses may comprise a pulse generator, means for decoupling may comprise a switch, means for combining may comprise an adder and/or a multiplier, means for receiving may comprise a receiver, and means for detecting amplitude may comprise an amplitude detector. Moreover, it should be understood that these components may be implemented in other ways using other structures and/or other operations. Also, some or all of the functionality of one or more of these components may be implemented using other types of components.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware, various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of machine-readable storage medium known in the art. An exemplary storage medium may be coupled to a machine such as, for example, a computer/processor (which may be referred to herein, for convenience, as a "processor") such the processor can read information (e.g., software instructions) from and write information to the storage medium. An exemplary storage medium may be integral to the processor. The processor and the storage medium may reside in an ASIC. The ASIC may reside in user equipment. In the alternative, the processor and the storage medium may reside as discrete components in user equipment.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the present disclosure is not intended to be limited to the aspects shown herein but is to be accorded the widest scope consistent with the principles and novel features disclosed herein.

What is claimed is:

1. An apparatus for signal processing, comprising:
    a delay line having a delay that is adapted to be adjusted in accordance with a control signal;
    a feedback path adapted to couple an output of the delay line to an input of the delay line;
    a counter coupled to the output of the delay line and adapted to generate a count by counting pulse signals outputted by the delay line; and
    a controller coupled to an output of the counter and adapted to generate the control signal based on the count.

2. The apparatus of claim 1, further comprising a signal generator adapted to generate at least one seed pulse signal that is fed to the input of the delay line.

3. The apparatus of claim 1, further comprising a signal generator adapted to generate a plurality of seed pulse signals that are fed to the input of the delay line, while the pulses signals are concurrently routed from the output of the delay line through the feedback path.

4. The apparatus of claim 1, wherein:
    the feedback path is adapted to feed the pulse signals to the input of the delay line; and
    the controller is adapted to compare the count generated by the counter with an expected count.

5. The apparatus of claim 4, wherein the controller is adapted to generate the control signal based on a difference between the count and the expected count.

6. The apparatus of claim 4, wherein the controller is adapted to adjust the expected count or the count to compensate for a component delay in the feedback path.

7. The apparatus of claim 6, wherein the controller is adapted to compensate for the component delay in accordance with a statistical mean associated with the component delay.

8. The apparatus of claim 1, wherein the feedback path comprises an amplifier adapted to provide gain in the feedback path.

9. The apparatus of claim 8, further comprising a pulse detector adapted to generate a gain control signal in accordance with an amplitude of at least one of the pulse signals outputted by the delay line, wherein the amplifier is adapted to adjust the gain in the feedback path in accordance with the gain control signal.

10. The apparatus of claim 1, wherein the feedback path comprises a pulse regenerator.

11. The apparatus of claim 10, wherein the pulse regenerator comprises a matched filter.

12. A method of signal processing, comprising:
    coupling pulse signals outputted by a delay line to an input of the delay line using a feedback path;
    counting the pulse signals outputted by the delay line;
    adjusting a delay of the delay line based on the counting; and
    generating seed pulse signals and feeding the seed pulse signals to the input of the delay line, while concurrently routing the pulse signals outputted by the delay line through the feedback path.

13. The method of claim 12, wherein adjusting the delay further comprises comparing an expected count with a count generated by the counting.

14. The method of claim 13, wherein adjusting the delay further comprises adjusting the delay by an amount that is related to a difference between the count and the expected count.

15. A method of signal processing, comprising:
coupling pulse signals outputted by a delay line to an input of the delay line;
counting the pulse signals outputted by the delay line;
adjusting a delay of the delay line based on the counting, wherein adjusting the delay further comprises comparing an expected count with a count generated by the counting; and
adjusting the expected count or the count to compensate for a component delay in a feedback path.

16. The method of claim 15, wherein the expected count or the count is adjusted according to a statistical mean associated with the component delay.

17. A method of signal processing, comprising:
coupling pulse signals outputted by a delay line to an input of the delay line;
counting the pulse signals outputted by the delay line;
adjusting a delay of the delay line based on the counting; and
adjusting a gain of the pulse signals coupled to the input of the delay line.

18. The method of claim 17, wherein the gain is based on a detection of at least a portion of the pulse signals outputted by the delay line.

19. A method of signal processing, comprising:
coupling pulse signals outputted by a delay line to an input of the delay line;
counting the pulse signals outputted by the delay line;
adjusting a delay of the delay line based on the counting; and
regenerating the pulse signals and wherein coupling the pulse signals to the input of the delay line comprises coupling the regenerated pulse signals to the input of the delay line.

20. The method of claim 19, wherein regenerating the pulse signals comprises performing a matched filter operation on the pulse signals.

21. An apparatus for signal processing, comprising:
means for coupling pulse signals outputted by a signal delaying means to an input of the signal delaying means;
means for counting the pulse signals outputted by the signal delaying means;
means for adjusting a delay of the signal delaying means based on the counting, wherein adjusting the delay further comprises comparing an expected count with a count generated by the means for counting; and
means for adjusting the expected count or the count to compensate for a component delay in a feedback path.

22. A computer-program product, comprising:
a non-transitory computer-readable storage medium encoded with codes for causing an apparatus to:
couple pulse signals outputted by a delay line to an input of the delay line;
generate a count of the pulse signals outputted by the delay line;
adjusting a delay of the delay line based on the count, wherein adjusting the delay further comprises comparing an expected count with the generated count; and
adjusting the expected count or the count to compensate for a component delay in a feedback path.

* * * * *